(12) United States Patent
Sluijk et al.

(10) Patent No.: US 6,663,332 B1
(45) Date of Patent: Dec. 16, 2003

(54) SYSTEM FOR THE TREATMENT OF WAFERS

(75) Inventors: Boudewijn Gijsbert Sluijk, Eindhoven (NL); Christianus Gerardus Maria De Ridder, Hoogland (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/600,695

(22) PCT Filed: Jan. 27, 1999

(86) PCT No.: PCT/NL99/00047

§ 371 (c)(1),
(2), (4) Date: Oct. 10, 2000

(87) PCT Pub. No.: WO99/38199

PCT Pub. Date: Jul. 29, 1999

(30) Foreign Application Priority Data

Jan. 27, 1998 (NL) .............................................. 1008143

(51) Int. Cl.⁷ .............................................. B65G 49/07
(52) U.S. Cl. .................. 414/160; 414/217; 414/331.05; 414/416.08; 414/805; 414/940
(58) Field of Search .................. 414/935, 939, 414/937, 940, 331.03, 332.05, 160, 217, 217.1, 806, 416.01, 416.03, 416.08, 805, 811; 432/239; 118/719, 500

(56) References Cited

U.S. PATENT DOCUMENTS

| | | | |
|---|---|---|---|
| 4,986,715 A | * | 1/1991 | Asakawa ............... 414/331.05 |
| 5,178,639 A | | 1/1993 | Nishi |
| 5,254,170 A | | 10/1993 | Devilbiss et al. |
| 5,387,265 A | * | 2/1995 | Kakizaki et al. ........ 118/725 X |
| 5,407,449 A | | 4/1995 | Zinger |
| 5,464,313 A | | 11/1995 | Ohsawa |
| 5,549,473 A | * | 8/1996 | Valentian ........... 414/331.05 X |
| 5,562,383 A | * | 10/1996 | Iwai et al. .............. 414/940 X |
| 5,788,448 A | * | 8/1998 | Wakamori et al. ...... 414/940 X |
| 6,143,083 A | * | 11/2000 | Yonemitsu et al. ..... 414/940 X |
| 6,318,944 B1 | * | 11/2001 | Shimeno et al. ........ 414/940 X |
| 6,481,945 B1 | * | 11/2002 | Hasper et al. .............. 414/217 |
| 6,540,465 B2 | * | 4/2003 | Tometsuka .................. 414/160 |
| 2002/0037210 A1 | * | 3/2002 | Matsunaga et al. .... 414/416.08 |

FOREIGN PATENT DOCUMENTS

| NL | 1005410 | 2/1997 |
|---|---|---|
| WO | WO 98/36444 | 8/1998 |

* cited by examiner

*Primary Examiner*—James W. Keenan
(74) *Attorney, Agent, or Firm*—Knobbe, Martens, Olson & Bear LLP

(57) ABSTRACT

Installation for treatment of wafers in a reactor. To that end a series of wafers is placed in a wafer rack and fed into the reactor. Transport into and out of the reactor, which is sited in an enclosed chamber, takes place with the aid of conveyor means. The wafers are transferred from the wafer rack to one or more cassettes. During this operation the wafer rack is always in the vertical position, that is to say the wafers are horizontal. The same preferably also applies to the cassettes, so that the wafers remain horizontal throughout the entire process.

31 Claims, 2 Drawing Sheets ent (1) C. §119 to , filed Jan. 27, 1999, lication No. 1008143,

SYSTEM FOR THE TREATMENT OF WAFERS

FOREIGN APPLICATION PRIORITY DATA

The present application is a U.S. National Phase application claiming the priority benefit under 35 U.S.C. §119 to PCT application No. PCT/NL99/00047, filed Jan. 27, 1999, and the originating Netherlands application No. 1008143, filed Jan. 27, 1998.

FIELD OF THE INVENTION

The present invention relates generally to systems for treating semiconductor substrates and, more particularly, to transfer systems for transferring and treating a plurality of substrates simultaneously.

BACKGROUND AND SUMMARY OF THE INVENTION

A system of this type is disclosed in U.S. Pat. No. 5,178,639. With this known system the cassettes are arranged in a store in such a way that the wafers are positioned essentially vertically. Via a screw conveyor mechanism, the cassettes containing the wafers, still positioned vertically, are moved in front of a wafer-handling robot, which then transfers the wafers to a horizontal boat. That is to say the wafers are placed in the vertical position in the boat. The 'boat' is then tilted through a quarter turn and placed on a straight line conveyor. There are a number of reactors along said conveyor and the 'boat' is fed to the relevant reactor as required.

It has been found that, with an installation of this type, if the treatment time in the reactors concerned is shortened, capacity problems arise with the various conveyor means for moving the wafers from the cassette store to the reactors concerned.

The aim of this invention is to perform said transport in an effective manner, as a result of which the capacity of the reactors can be fully utilised even in the case of a relatively short treatment time in the reactors.

This aim is realised with a system as described above which has the characterizing features of claim 1. With a construction of this type the 'boat' will always be in a vertical position, that is to say the wafers will always be in a horizontal position when the 'boat' is handled. The transport can be further optimised by using a carousel in combination with at least two reactors. Moreover, with the construction according to the invention a relatively simple handling robot can suffice. Further simplification can take place if, in addition, the store is designed for receiving the auxiliary containers upright and if the first transfer means comprise a bearing surface for said wafers which extends essentially horizontally. Because the auxiliary containers are now received upright, this means that the wafers are always essentially horizontal.

As the diameter of wafers becomes larger, the spacing thereof in cassettes increases. To be able to maintain the same storage capacity this means that the magazines in which such cassettes are stored become ever higher. If the wafers are taken directly from the cassettes and placed in a 'boat', this means that the wafer-handling robot must be able to move over a great height. This means that an expensive wafer-handling robot is needed because the tolerances of the positioning of wafers are particularly small.

Reference is made to U.S. Pat. No. 5,254,170, in which an installation is described in which the wafers are always positioned horizontally and a wafer-handling installation of this type is used. With the construction according to the present invention it can be assumed that there is a relatively high store for cassettes and the cassettes can be positioned at a uniform level using a relatively simple robot and, starting from this level, can be handled by a wafer-handling robot having a relatively small height range in order to be placed in the 'boat'. The height range of the wafer-handling robot is in fact determined by the height of the 'boat'.

Compared with the constructions with one reactor combined with one carousel in a single chamber, as disclosed, for example, in U.S. Pat. No. 5,407,449, the system according to the present invention which has been described above makes an appreciable improvement in capacity possible by installing two reactors. Furthermore, as a result of the presence of an intermediate station for both the cassettes and for the 'boat' in the present invention it is possible to allow the carousel in the treatment chamber and the carousel of the wafer storage station to rotate while transferring the wafers from the cassettes into the 'boat' or vice versa. By this means all components of the system can be utilised to the optimum. The construction according to U.S. Pat. No. 5,407,449 does not have this flexibility and the carousel of the treatment chamber and the carousel of the wafer storage station are locked in place while handling the wafers. In percentage terms, the increase in capacity is less when more than two reactors are installed. Furthermore, capacity problems can rapidly arise in one of the conveyor means when there are more than two reactors and when the treatment time is relatively short. It has been found that with the process times most commonly used, which are between 1 and 3 hours, a configuration with two reactors leads to the most optimum utilisation of all components of the system.

Therefore, if there is a need to use more than two reactors it is attractive to site a number of the systems described above alongside one another. That is to say by this means systems which operate independently of one another are produced which can be accommodated within a restricted area. This is in contrast to the construction according to U.S. Pat. No. 5,178,639, in which it is proposed when increasing the number of furnaces simply to place these furnaces alongside one another in a row. In the event of the failure of one of the components which provide for the feed/removal of cassettes and 'boats' and/or wafer handling the entire system will immediately become inoperative. With the assembly according to the present invention, consisting of at least two systems arranged alongside one another, as described above, systems which function independently of one another are obtained and operational reliability is appreciably improved.

In Netherlands Patent 1 005 410 in the name of the Applicant it is proposed no longer to allow the wafer racks to perform exclusively an up and down movement with respect to the reactor, which in general is set up vertically, but also to use these wafer racks for transport of the wafers through the chamber in which such reactors have been installed. In the Netherlands Patent 1 005 410 it is described that the wafer racks are positioned on a rotary platform and, once they have arrived beneath the furnace concerned, are introduced into the furnace by a special device, the underside of the wafer racks also comprising the closure stop for the underside of the furnace.

With constructions of this type it is always necessary to transfer the wafers from the cassettes in which they are fed/removed into/from the wafer racks.

With installations known to date this transfer took place at the interface between the chamber in which the reactor was installed and the store for the cassettes. That is to say, when the conveyor means for feeding the wafer racks to the reactors are stationary, in a certain position the relevant wafer rack located closest to the requisite robot is loaded or unloaded from or into an associated cassette.

As indicated above, it has been found that for certain treatment processes the capacity of the total installation is no longer determined by the capacity of the various reactors.

The aim of the present invention is to provide an installation with which the capacity can be further increased without enlarging the available floor area. After all, in general an installation of this type will be operated under "clean room" conditions where floor area is particularly expensive.

According to the present invention this objective is achieved in that an intermediate store is arranged between said treatment area and the storage means equipped for receiving said container and in that said transfer means comprise first transfer means for moving said container into and out of said treatment chamber.

According to an advantageous embodiment of the invention, the wafers are not moved directly from the wafer racks to the cassette store but the cassettes are removed from the store and brought into an optimum position for receiving or dispensing the wafers. The capacity can be further increased as a result.

According to a further advantageous embodiment of the invention the intermediate store for the wafer racks, which has been described above, can be closed off with respect to both the reactor chamber and the storage area. A lock operation can be provided by this means.

As already indicated, the reactors can comprise furnaces, but it must be understood that said reactors are able to provide any other treatment of wafers disclosed in the prior art. Such reactors can be arranged such that they operate either horizontally or vertically. Of course, the construction of the associated conveyor means is dependent on this. A horizontally arranged rotary platform has been mentioned above as an example for a reactor which can be vertically loaded/unloaded.

BRIEF DESCRIPTION OF THE DRAWINGS

The invention will be explained in more detail below with reference to an illustrative embodiment shown in the drawings. In the drawings.

DETAILED DESCRIPTION FOR THE PREFERRED EMBODIMENT

Figure 2:
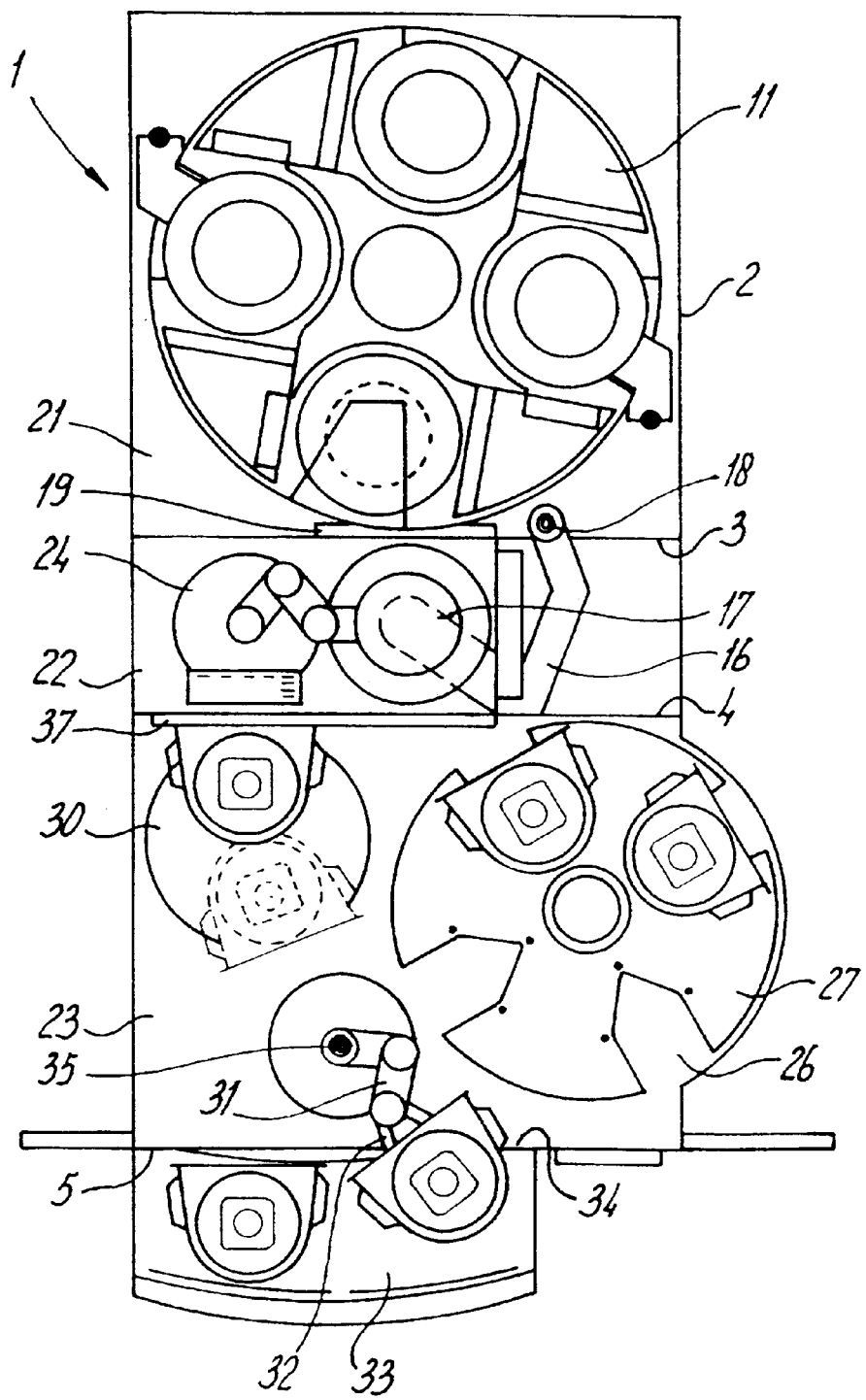
FIG. 2 shows, diagrammatically, a plan view of the installation according to FIG. 1.

The installation according to the invention is indicated in its entirety by 1. This installation comprises a housing 2 and will in general have been installed in a so-called "clean room". In addition to housing 2, partitions 3, 4 and 5 are also present, as can be seen in particular from FIG. 2. Housing 2 delimits, with partition 3, reactor area or chamber 21. A chamber 22 in which the intermediate store according to the invention is located is delimited between housing 2 and partitions 3, 4 (and closure 19). A chamber 23 is delimited between partitions 4 and 5 and housing 2. Reference numeral 33 represents an is the introduction chamber.

Two reactors, which in this case comprise furnaces 6, 7, are arranged in reactor chamber 21. The furnaces are positioned vertically and wafer racks, indicated by 12, filled with wafers 13, are introduced into the furnaces 6, 7 in the vertical direction from below. To this end each furnace has an insertion arm 14, which is movable in the vertical direction. Only one insertion arm 14 can be seen in FIG. 1. The wafer rack 12 is provided at the bottom with an insulating plug, which is not indicated in more detail, which provides a seal between the rack and the furnace. Special measures are taken to optimise the operation in the furnace.

A rotary platform 11, provided with cut-outs 15, is fitted. Those cut-outs 15 are shaped such that, if the cut-outs 15 have been brought into the correct position, arm 14 is able to move up and down through the cut-outs 15. On the other hand, the diameter of the bottom of the wafer rack 12 is such that said diameter is larger than the cut-out 15 in the platform 11, so that when the arm 14 moves downwards from the position shown in FIG. 1 the wafer rack 12 can be placed on rotary platform 11 and can be removed therefrom again in a reverse operation.

The wafer racks can be fed to both furnace 6 and furnace 7. It is possible to perform a successive treatment therein. It is also possible to allow parallel groups of wafer racks to be treated exclusively by furnace 6 and exclusively by furnace 7. The wafer racks must be provided with wafers. After all, wafers 13 are supplied in (transport) cassettes 10 which, from the introduction chamber 33, are placed in store 8 through a closable opening 34 with the aid of arm 31. Arm 31 is provided with a bearing surface 32 which has dimensions a little smaller than those of the series of cut-outs 26 in rotary platforms 27. A number of such rotary platforms are provided one above the other in the vertical direction in store 8. Arm 31 is movable in the vertical direction with the aid of height adjuster 35. Arm 31 is mounted such that said arm is able not only to pick up/remove cassettes from/to introduction chamber 33 to/from store 8, but that it is also possible to move cassettes from/to store 8 to/from rotary platform 30. The rotary platform 30 is constructed such that on rotation the cassette is placed against partition 4 where an opening 37 has been made so that, after opening the cassettes with the aid of arm 24, wafers can be taken one by one from the cassette concerned and can be placed in the wafer rack 12 located in chamber 22. The wafer rack 12 is supported by hinged arm 16 which is provided with a bearing surface 17 at the end, the dimensions of which are once again somewhat smaller than those of cut-outs 15. This arm 16 is able to move with the wafer rack through a closable opening 19 in partition 3. A closure 19 is provided in order to be able to close off chamber 21 from chambers 22 and 23.

Figure 1:
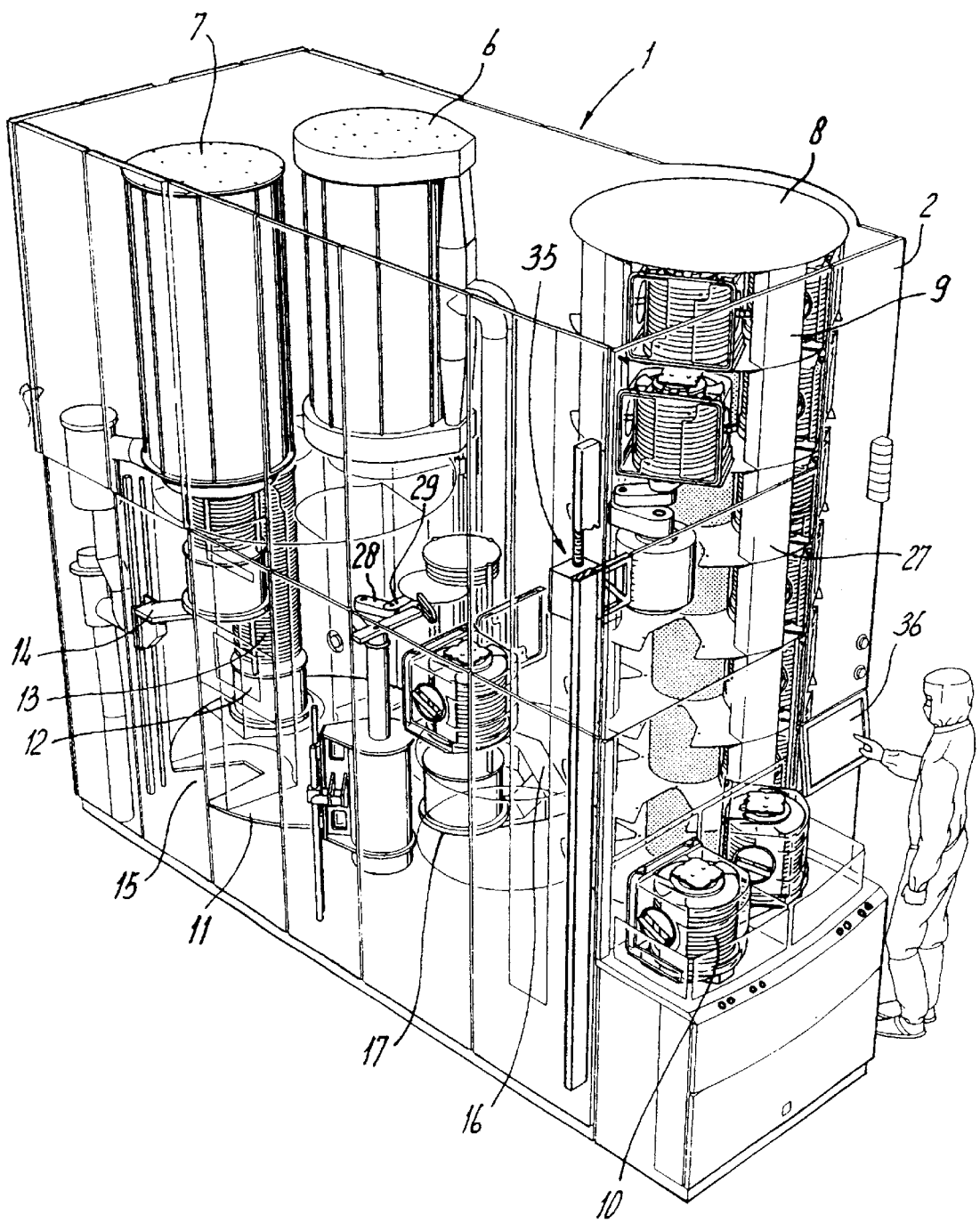
FIG. 1 shows, diagrammatically and partially exposed, a perspective view of the installation according to the invention.

The treatment of a large number of wafers can be carried out as follows:

The operator, shown diagrammatically in FIG. 1, loads a store 8 by introducing a number of cassettes and carrying out control operations on panel 36. Each of the cassettes 10 is transferred from the introduction chamber 33 with the aid of arm 31 into the storage compartments 9 made for these cassettes in store 8. This means that, starting from the lowest position for removing the relevant cassette 10 from chamber 33 through the opening 34, said cassette can then be moved upwards for moving into a higher compartment 9 of the store 8. By rotation of the store 8 it is possible to fill various compartments with cassettes 10.

After filling store 8, no further human intervention is required with the automated embodiment of the installation according to the present invention. The cassettes 10 concerned are then removed from the store 8 by arm 31 and placed on rotary platform 30. The cassettes 10 are rotated on the rotary platform 30 and placed against partition 4. With the aid of arm 24, the wafers are removed wafer by wafer and placed in wafer rack 12 placed on swing arm 16. In the interim the rotary platform 11 is able to move in the reactor chamber 21 in the optimum manner with regard to the treatments to be carried out on the wafers present inside the reactor chamber 21. After wafer rack 12 has been filled in chamber 22 and has become or becomes available to one of the reactors 6, 7, opening 19, which was closed up to this time, is exposed and said filled wafer rack is placed on rotary platform 11. The rotary platform then moves one position immediately or later and a filled wafer rack 12 is removed from platform 11. Treated wafers are located in said filled rack 12. Said wafers execute a movement counter to the above.

In this way it is possible to perform the operation of removing wafers from the wafer racks 12 in an area outside treatment chamber 21. The same applies with respect to the operation for taking the wafers out of the cassette 10 is no longer necessary to allow arm 31 to move the wafers one by one from the store 8 to the wafer rack, but, as a result of the use of the rotary platform 30, it is possible to move a number of wafers at the same time, including the associated cassettes.

It will be understood that without an appreciable increase in the floor area of the installation it is possible appreciably to increase the capacity thereof, certainly in the case of treatments of relatively short duration or in the case of an appreciable number of reactors, without allowing the cost price to rise accordingly.

Those skilled in the art will understand that numerous modifications to the above are possible. For instance, it is possible for one reactor to suffice or for more than two reactors to be present. The store can be of different construction, whilst the various displacement mechanisms can likewise be adjusted depending on the requirement. Such modifications are all considered to fall within the scope of the present claims.

What is claimed is:

1. A system for simultaneously treating a plurality of substrates, comprising:
    a treatment chamber having an upper region and a lower region, the upper region containing at least two reactors and the lower region provided with a closable opening;
    a substrate transfer chamber adjacent the closable opening of the treatment chamber, the transfer chamber being configured to accommodate a substrate rack;
    a rack conveyor housed in the lower region of the treatment chamber, the rack conveyor having multiple accommodations for substrate racks, the rack conveyor being configured to horizontally transfer racks among a plurality of rack positions within the lower region;
    at least one elevator configured to transfer substrate racks to and from one of the rack positions within the lower region to the at least two reactors;
    a substrate handling robot disposed in the substrate transfer chamber, the robot being configured to transfer substrates to and from the rack when the rack is positioned within the substrate transfer chamber, and
    a rack transfer mechanism configured to transfer racks to and from the substrate transfer chamber through the closable opening from and to the rack conveyor.

2. The system of claim 1, further comprising a cassette transfer mechanism configured to convey substrate cassettes to and from a substrate loading/unloading cassette position accessible to the substrate handling robot.

3. The system of claim 2, wherein the cassette transfer mechanism comprises a cassette turntable.

4. The system of claim 3, wherein the cassette transfer mechanism further comprises a cassette transfer arm configured to transfer cassettes between the cassette turntable and a cassette storage.

5. The system of claim 4, wherein the cassette storage includes a plurality of vertical levels.

6. The system of claim 5, wherein each vertical level includes a plurality of cassette compartments.

7. The system of claim 5, wherein the cassette transfer arm comprises an elevating mechanism.

8. The system of claim 5, wherein each vertical level includes a cassette platform having at least one cut-out therein the cut-out sized and shaped to allow the cassette transfer arm to pass vertically therethrough and to allow the cassette platform to support a cassette thereon.

9. The system of claim 2, further comprising a wall separating the cassette transfer mechanism and the substrate transfer chamber, the wall having a closable substrate access opening adjacent the substrate loading/unloading cassette position.

10. The system of claim 1, wherein the rack transfer mechanism comprises a rack transfer arm having a bearing surface configured to support a substrate rack.

11. The system of claim 10, wherein the rack conveyor comprises a movable platform having at least two cut-outs therein, the cut-outs being sized and shaped to allow the bearing surface of the rack transfer arm to translate vertically therethrough and to allow the platform to support a substrate rack.

12. The system of claim 11, wherein the movable platform is rotatable.

13. The system of claim 12, wherein elevator comprises a lift arm configured to support a substrate rack thereon and to translate vertically through the cut-out.

14. The system of claim 1, wherein the upper region of the treatment chamber houses exactly two reactors.

15. The system of claim 14, comprising two elevators, each of the elevators configured to lift a substrate rack from a different one of the rack positions within the lower region to a different one of the two reactors.

16. The system of claim 1, wherein the rack transfer mechansim is configured to translate a substrate rack in an upright orientation.

17. The system of claim 1, wherein the at least two reactors each comprise a furnace.

18. The system of claim 1, wherein the rack conveyor is configured to have a number of substrate rack accommodations greater than a number of reactors.

19. The system of claim 18, wherein the treatment chamber comprises exactly four substrate rack accommodations and two reactors.

20. A method for transferring and treating a plurality of wafers in a batch system, comprising:
    loading a plurality of wafers into a first wafer rack within an intermediate chamber;
    transferring the first rack from the intermediate chamber into a treatment chamber through a closable opening in a partition separating the treatment chamber from the intermediate chamber;
    horizontally transferring the first rack within the treatment chamber to a lift position;
    vertically transferring the first rack from the lift position to a reactor within the treatment chamber, and
    transferring a second plurality of wafers within the intermediate chamber between a second wafer rack and a wafer cassette, while horizontally transferring the first rack.

21. The method of claim 20, further comprising removing the second rack holding treated wafers of the second plurality of wafers from the treatment chamber and moving the second rack to the intermediate chamber.

22. The method of claim 20, wherein horizontally transferring comprises moving a platform within the treatment chamber.

23. The method of claim 22, wherein moving the platform comprises rotating the platform.

24. The method of claim 22, further comprising moving the platform while loading the plurality of wafers into the first rack to accomplish treatment of other wafers within the treatment chamber.

25. The method of claim 24, wherein the closable opening is closed while loading the wafers into the first rack.

26. The method of claim 20, wherein transferring the first rack from the intermediate chamber into the treatment chamber comprises supporting the first rack on a bearing surface of a hinged swing arm and rotating the arm about the hinge.

27. The method of claim 26, wherein transferring the first rack from the intermediate chamber into the treatment chamber further comprises passing the bearing surface of the hinged swing arm through a cut-out in a movable platform within the treatment chamber, thereby supporting the first rack on the movable platform, and subsequently removing the hinged swing arm from the intermediate chamber, the bearing surface no longer supporting the first rack.

28. The method of claim 20, further comprising moving the cassette having a plurality of wafers therein to a second opening in a second partition separating the intermediate chamber from an intermediate store.

29. The method of claim 28, wherein loading comprises removing wafers from the cassette to the first rack.

30. The method of claim 29, wherein moving the cassette comprises rotating a turntable adjacent the second opening.

31. The method of claim 30, wherein moving the cassette further comprises transferring the cassette from a cassette storage to the turntable.

* * * * *